(12) United States Patent
McLaury

(10) Patent No.: US 11,316,521 B2
(45) Date of Patent: Apr. 26, 2022

(54) POWER SUPPLY REGULATION FOR PROGRAMMABLE LOGIC DEVICES

(71) Applicant: Lattice Semiconductor Corporation, Hillsboro, OR (US)

(72) Inventor: Loren McLaury, Hillsboro, OR (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 17/115,560

(22) Filed: Dec. 8, 2020

(65) Prior Publication Data

US 2021/0175888 A1     Jun. 10, 2021

Related U.S. Application Data

(60) Provisional application No. 62/945,812, filed on Dec. 9, 2019.

(51) Int. Cl.
*H03K 19/17772*    (2020.01)
*H03K 19/1776*     (2020.01)

(52) U.S. Cl.
CPC ............ *H03K 19/17772* (2013.01); *H03K 19/1776* (2013.01)

(58) Field of Classification Search
None
See application file for complete search history.

(56) References Cited

U.S. PATENT DOCUMENTS

| | | | |
|---|---|---|---|
| 7,463,057 B1 * | 12/2008 | Rahim | H03K 19/1776 326/113 |
| 7,498,835 B1 * | 3/2009 | Rahman | H03K 19/17772 326/38 |
| 9,286,952 B2 | 3/2016 | McLaury | |
| 2015/0380064 A1 * | 12/2015 | McLaury | G11C 11/417 365/154 |

* cited by examiner

*Primary Examiner* — Anh Q Tran
(74) *Attorney, Agent, or Firm* — Haynes and Boone, LLP

(57) ABSTRACT

Various techniques are provided to implement power supply regulation for programmable logic devices (PLDs). In one example, a method includes powering configuration memory cells of a PLD with a first voltage. The method further includes configuring the configuration memory cells while the configuration memory cells are powered by the first voltage. The method further includes operating the PLD while the configuration memory cells are powered with a second voltage higher than the first voltage. The method further includes powering the configuration memory cells with a third voltage lower than the first voltage in response to an indication to transition the PLD to a sleep mode of the PLD. Related systems and devices are provided.

20 Claims, 7 Drawing Sheets

POWER SUPPLY REGULATION FOR PROGRAMMABLE LOGIC DEVICES

CROSS-REFERENCE TO RELATED APPLICATIONS

This application claims priority to and the benefit of U.S. Provisional Patent Application No. 62/945,812 filed Dec. 9, 2019 which is incorporated by reference herein in its entirety.

TECHNICAL FIELD

The present invention relates generally to memories and, more particularly, to power supply regulation for programmable logic devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources, including by way of non-limiting example programmable logic gates, look-up tables (LUTs), embedded hardware, interconnections, and/or other types of resources, available in particular PLDs. Physical placement and routing for the synthesized and mapped user designs may then be determined to generate configuration data for the particular PLDs. The generated configuration data is loaded into configuration memory of the PLDs to implement the programmable logic gates, LUTs, embedded hardware, interconnections, and/or other types of configurable resources. The loading of the configuration data may take a considerable amount of time.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Various techniques are provided to facilitate power supply regulation for PLDs. A PLD may be powered by a voltage control circuit using one of multiple voltage levels. The voltage control circuit may provide a voltage to a power supply voltage rail coupled to the PLD. The PLD may be powered with a first voltage level during a configuration mode of the PLD. During the configuration mode, configuration memory cells of the PLD are configured (e.g., programmed). The PLD may be powered with a second voltage level during a functional mode of the PLD. During the functional mode, the PLD provides the programmed (e.g., user-desired) input/output (I/O) and logic functionality. The second voltage level may be higher than the first voltage. The PLD may be powered with a third voltage level during a sleep mode of the PLD. The sleep mode may involve turning off unused logic to conserve power. The third voltage level may be lower than the first voltage.

In an embodiment, the voltage control circuit may include a voltage regulator and a switching circuit. The switching circuit may tie the first voltage to the power supply voltage rail during the configuration mode and tie the third voltage to the power supply voltage rail during the sleep mode. During the functional mode, the voltage regulator may generate the second voltage and provide the second voltage to the power supply voltage rail. In some cases, the voltage regulator is disabled during the configuration mode and the sleep mode.

Using various embodiments, a PLD may be transitioned to the sleep mode to conserve power. In this regard, embodiments herein help satisfy increased demands on reducing power consumption in semiconductor integrated circuits (ICs), including user-configurable ICs such as PLDs. As user-configurable ICs may include hundreds of thousands to millions of configuration memory cells, placing these configuration memory cells in the sleep mode may have significant power savings for the ICs. In some cases, the sleep mode may save about or over half the power relative to the functional mode.

Figure 1:
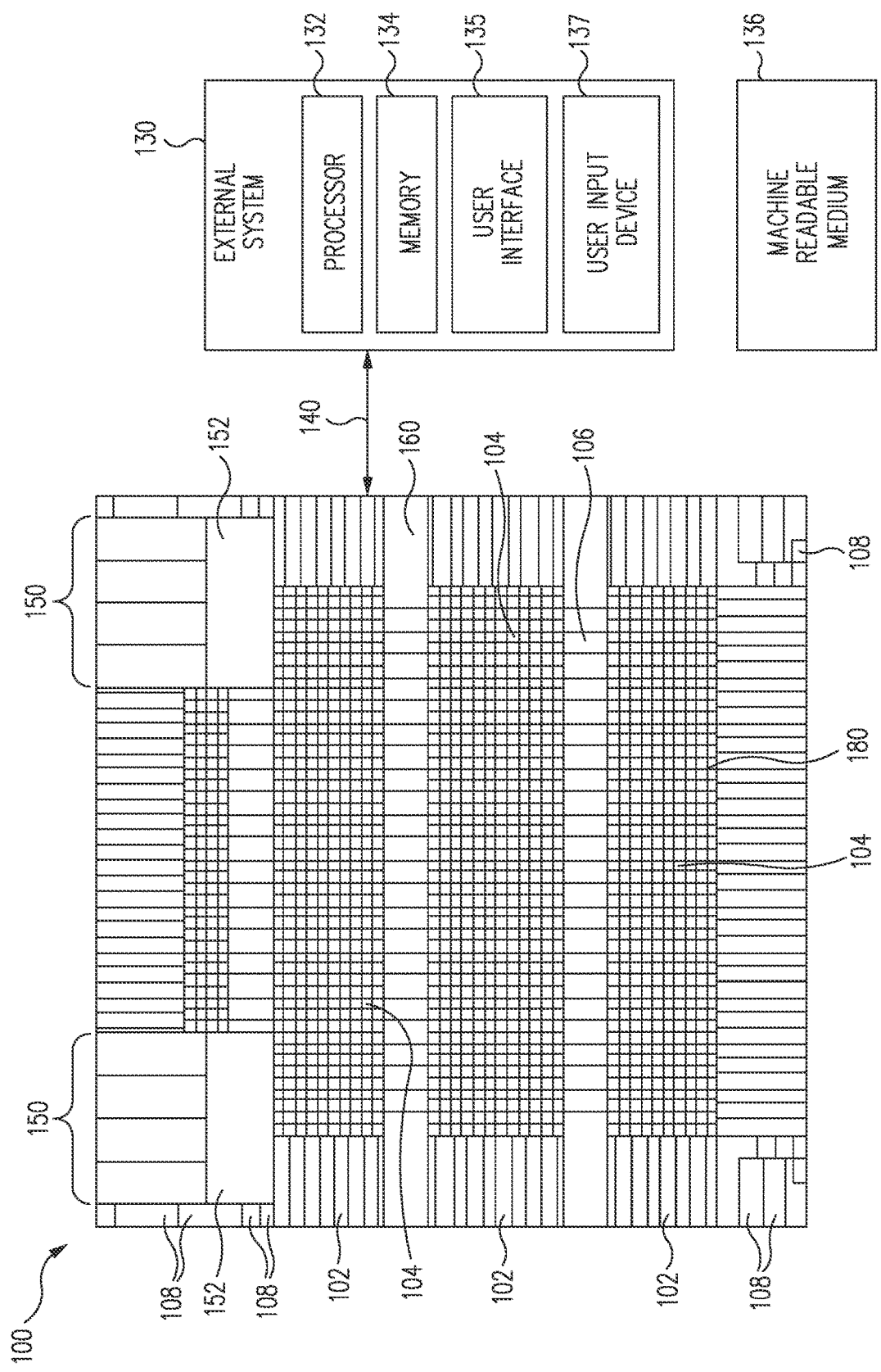
FIG. 1 illustrates a block diagram of a PLD in accordance with an embodiment of the disclosure

Referring now to the figures, FIG. 1 illustrates a block diagram of a PLD 100 in accordance with an embodiment of the disclosure. The PLD 100 (e.g., an FPGA, a CPLD, an FPSC, or other type of programmable device) generally includes I/O blocks 102 and programmable logic blocks (PLBs) 104. In some cases, the PLD 100 may generally be any type of programmable device (e.g., programmable integrated circuit) with distributed configuration, which may involve loading configuration data through pins, shifting to appropriate locations in associated fabric, and configuring configuration memory cells. The PLBs may also be referred to as logic blocks, programmable functional units (PFUs), or programmable logic cells (PLCs). In an aspect, the PLBs 104 may collectively form an IC core or logic core of the PLD 100. The I/O blocks 102 provide I/O functionality (e.g., to support one or more I/O and/or memory interface standards) for the PLD 100, while the PLBs 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the PLBs 104).

The PLD 100 may include blocks of memory 106 (e.g., blocks of erasable programmable read-only memory (EEPROM), block static RAM (SRAM), and/or flash memory), clock-related circuitry 108 (e.g., clock sources, phase-locked loop (PLL) circuits, and/or delay-locked loop (DLL) circuits), and/or various routing resources 180 (e.g., interconnect and appropriate switching circuits to provide paths for routing signals throughout the PLD 100, such as for clock signals, data signals, control signals, wakeup signals, or others) as appropriate. The PLD 100 may include configuration and activation logic to receive configuration data, configure various programmable elements of the PLD 100, and activate functionality associated with these programmable elements. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or PLBs 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout the PLD 100, such as in and between the PLBs 104, hard IP blocks 160, and routing resources 180 to perform their conventional functions (e.g., storing configuration data that configures the PLD 100 or providing interconnect structure within the PLD 100). For example, the routing resources 180 may be used for internal connections within each PLB 104 and/or between different PLBs 104. It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100. For example, to configure the PLD 100, the system 130 may provide such configuration data to one or more of the I/O blocks 102, PLBs 104, SERDES blocks 150, and/or other portions of the PLD 100. In this regard, the external system 130 may include a link 140 that connects to a programming port (e.g., SPI, JTAG) of the PLD 100 to facilitate transfer of the configuration data from the external system 130 to the PLD 100. As a result, the I/O blocks 102, PLBs 104, various of the routing resources 180, and any other appropriate components of the PLD 100 may be configured to operate in accordance with user-specified applications. In some cases, the I/O blocks 102 or portion thereof may be designated for fast boot. In some cases, the PLBs 104 or portion thereof may be designated for fast boot.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100.

In some embodiments, the memory 106 of the PLD 100 may include non-volatile memory (e.g., flash memory) utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, PLBs 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100.

Figure 2:
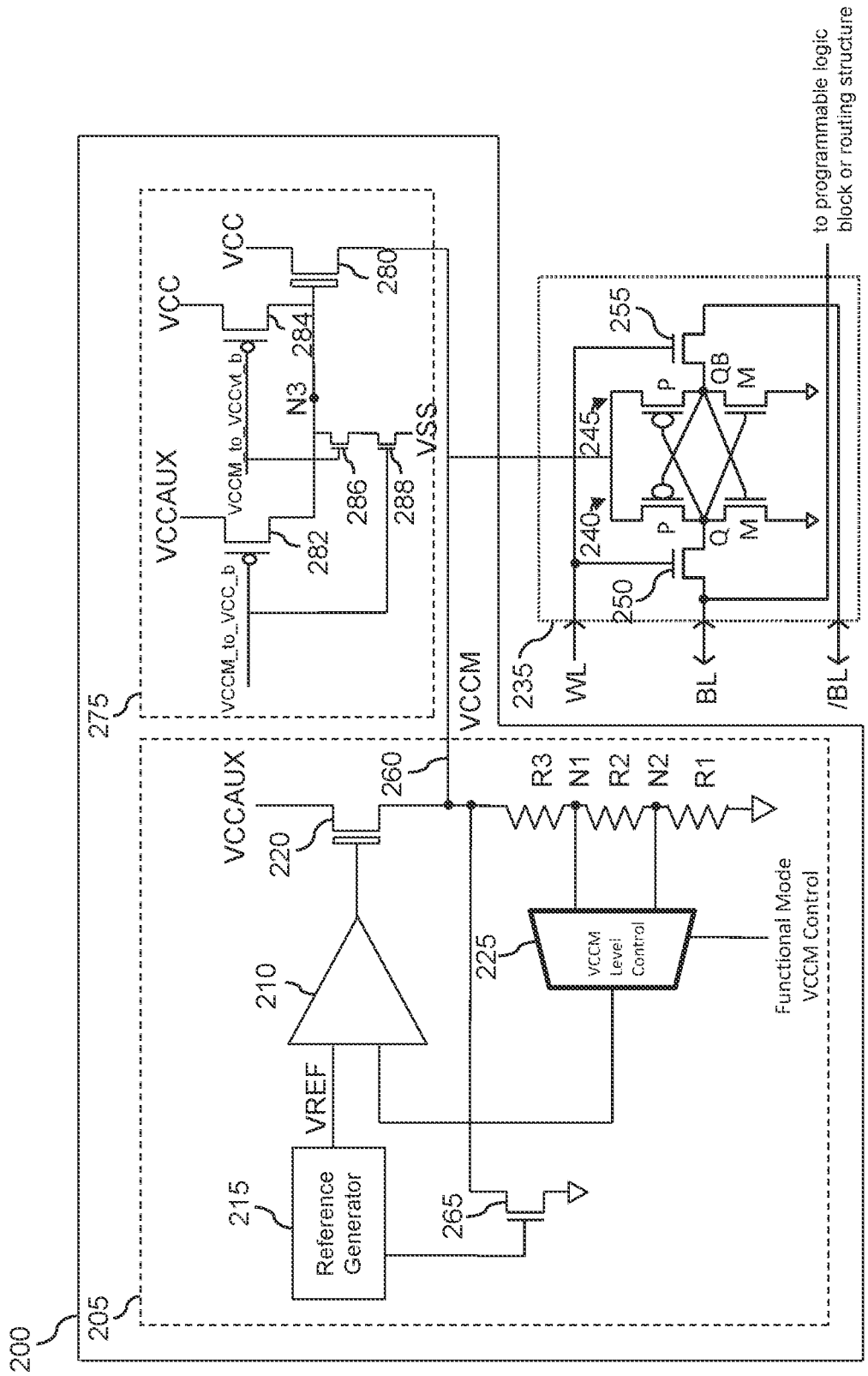
FIG. 2 illustrates a voltage control circuit for facilitating power supply regulation for PLDs in accordance with an embodiment.

FIG. 2 illustrates a voltage control circuit 200 for facilitating power supply regulation for PLDs in accordance with an embodiment. In this regard, the voltage control circuit 200 supplies a power supply voltage VCCM to SRAM cells of a PLD. In an embodiment, the PLD may be, may include, or may be a part of, the PLD 100 of FIG. 1. The SRAM cells may be configured to implement truth tables for logic blocks (not illustrated) and routing structures such as routing multiplexers (not illustrated). For illustration clarity, only a single SRAM cell 235 is shown in FIG. 2, but it will be appreciated that the voltage control circuit 200 typically provides the voltage VCCM on a power supply voltage rail 260 to numerous other SRAM cells of the PLD.

It is noted that the arrangement of P-type transistors and N-type transistors in FIG. 2 is provided by way of non-limiting example, and that a different arrangement of transistor-types and/or a different number of transistors may be used to implement a voltage control circuit as described herein (e.g., with appropriate adjustment to control signals/voltages). It is further noted that, although the configuration memory cell is an SRAM cell in FIG. 2, a voltage control circuit may be used to supply a voltage VCCM to other types of configuration memory cells.

The power supply voltage rail 260 (e.g., the power supply voltage VCCM) may be driven to one of multiple levels. For explanatory purposes, the power supply voltage rail 260 may be driven to one of three levels according to various embodiments. In other embodiments, the power supply voltage rail 260 may be driven to fewer than three levels, more than three levels, and/or different levels from those described herein.

Each of the three voltage levels to which the power supply voltage rail 260 is driven is associated with a mode of the PLD. In this regard, the voltage control circuit 200 may be referred to as facilitating a first mode, a second mode, or a third mode of the PLD. To facilitate the first mode, the voltage VCCM may be set to a voltage VCC. To facilitate the second mode, the voltage VCCM may be set to a voltage V2 that is higher than the voltage VCC. To facilitate the third mode, the voltage VCCM may be set to a voltage V3 that is lower than the voltage VCC. In an aspect, the first mode may be the configuration mode in which configuration data is being loaded into the PLD (e.g., the SRAM cells of the PLD). The configuration mode may also be referred to as a configuration write mode, a write mode, or a programming mode. The second mode may be the functional mode in which the programmable logic device provides I/O and logic functionality. The functional mode may also be referred to as an operational mode, a user mode, or a normal mode. The third mode may be a sleep mode in which the SRAM cells maintain their stored values while the power consumed by the SRAM cells is reduced relative to the configuration mode and the functional mode.

The voltage control circuit 200 includes a switching circuit 275 to facilitate setting of the voltage VCCM according to a desired mode. The switching circuit 275 includes transistors 280, 282, 284, 286, and 288. The transistor 280 couples to the power supply voltage rail 260 and a power supply node carrying a power supply voltage VCC. The transistor 282 couples to the transistor 280 and a power supply node carrying a power supply voltage VCCAUX. The transistor 284 couples to the transistor 280 and a power supply node carrying a power supply voltage VCC. A power supply voltage coupled to the transistor 280 may be from the same voltage supply or a different voltage supply that supplies the power supply voltage VCC to the transistor 284. As one example, the voltage VCC is between around 0.9 V and around 1 V. As one example, the voltage VCCAUX is around 1.8 V.

A state (e.g., on state or off state) of the transistors 282 and 288 is based on a control voltage vccm_to_vcc_b. For instance, as shown in FIG. 2, the transistor 282 is a PMOS transistor that is on when the control voltage vccm_to_vcc_b is associated with logic low (e.g., vccm_to_vcc_b is driven to a voltage level associated with logic low) and is off when the control voltage vccm_to_vcc_b is associated with logic high. A state of the transistors 284 and 286 is based on a control voltage vccm_to_vccvt_b. A state of the transistor 280 is based on a voltage at node N3. In an aspect, the control voltages vccm_to_vcc_b and vccm_to_vccvt_b may be set by a control circuit (not shown) coupled to the voltage control circuit 200. It is noted that, while vccm_to_vcc_b and vccm_to_vccvt_b are described as control voltages, they may instead be control bits having a binary value 0 or 1. Control voltages may be driven to certain voltage levels (e.g., voltage level associated with logic high or logic low) according to the binary value of the control bits.

The voltage control circuit 200 includes a voltage regulator 205. The voltage regulator 205 includes a differential amplifier 210, a voltage reference generator circuit 215, a transistor 220, a VCCM level control circuit 225, and a transistor 265. The voltage regulator 205 regulates the power supply voltage VCCM using a differential amplifier 210 that drives a gate of a transistor 220 accordingly. In an embodiment, the power regulator 205 may set the voltage VCCM to the voltage V2 associated with the second mode (e.g., the functional mode). The voltage V2 may be referred to as a regulated voltage. In FIG. 2, transistor 220 is an NMOS transistor but it may include a PMOS transistor in alternative embodiments. A drain of the transistor 220 couples to a power supply node carrying a power supply voltage VCCAUX. A power supply voltage VCCAUX coupled to the transistor 220 may be from the same voltage supply or a different voltage supply that supplies the power supply voltage VCCAUX to the transistor 282.

A source of the transistor 220 couples to the power supply voltage rail 260. To control the extent to which the differential amplifier 210 switches on the transistor 220 so as to charge the power supply voltage rail 260 and affect the power supply voltage VCCM accordingly, a control signal (denoted as functional mode VCCM control) controls the VCCM level control circuit 225 to control the voltage V2. A serial combination of a resistor R1, R2, and R3 couple between ground and a source of the transistor 220. Depending upon a state for the functional mode VCCM control signal, the VCCM level control circuit 225 may select node N1 between the resistors R2 and R3 or node N2 between the resistors R2 and R1 to drive an output coupled to one of the inputs for the differential amplifier 210. The selection may be performed as appropriate such that the voltage VCCM is set to a desired voltage level (e.g., the power supply voltage rail 260 is tied to the desired voltage level) for the voltage V2, which generally depends on application. In an aspect, the VCCM level control circuit 225 is a multiplexer. As one example, the voltage V2 is around 1.25 V.

The reference generator circuit 215 drives a remaining input of the differential amplifier 210 with a reference voltage VREF. As examples, the reference voltage VREF may be at around half of V2 or a quarter of V2 (e.g., with appropriate adjustments to a resistance of one or more of the resistors), although other voltage levels may be used for the reference voltage VREF. In an aspect, the reference generator circuit 215 is a bandgap reference circuit that drives the remaining input of the differential amplifier 210 with a bandgap voltage. A feedback loop is thus formed through the differential amplifier 210 with regard to the voltage on the selected node by the VCCM level control 225. In that regard, the resistors R1, R2, and R3 form a voltage divider that is driven by the power supply voltage VCCM. The symbols R1, R2, and R3 also identify the resistance of the corresponding resistor. Given this convention, the voltage at the node N1 equals VCCM*(R1+R2)/(R1+R2+R3). Similarly, the voltage at node N2 equals VCCM*(R1/(R1+R2+R3)). The negative feedback loop through the differential amplifier 210 functions to keep its input voltages the same such that differential amplifier 210 will drive the gate of the transistor 220 so that the transistor 220 conducts to charge VCCM so that the selected node voltage equals the reference voltage VREF. Thus, if the VCCM level control 225 selects the node N1, the power supply voltage VCCM equals VREF*(R1+R2+R3)/(R1+R2). If the VCCM level control 225 selects the node N2, the power supply voltage VCCM equals VREF*(R1+R2+R3)/R1. In one case, the voltage V2 is around 1.25 V when the node N1 is selected.

It is noted that components and arrangement thereof of the voltage regulator 205 shown in FIG. 2 are provided by way of non-limiting example. For example, the VCCM level control 225 need not be a multiplexer that selects from one of two nodes. In general, the voltage regulator 205 may be implemented in any manner as appropriate such that the voltage regulator 205 can set the voltage VCCM to a desired voltage level (e.g., tie the power supply voltage rail 260 to the desired voltage level). In this regard, the voltage $V_2$ may be trimmed up or trimmed down to set the voltage VCCM provided on the power supply voltage rail 260 to the desired voltage level.

The transistor 265 (e.g., also referred to as a shunt transistor) couples between the power supply voltage rail 260 and ground. In this fashion, there is a weak discharge of the power supply voltage rail 260 to provide a controlled way to discharge the power supply voltage VCCM from a higher voltage level to the reduced voltage level. In one embodiment, the reference generator circuit 215 may control the channel size in the transistor 265 to control the weak discharge rate for the power supply voltage rail 260.

In an embodiment, for the voltage control circuit 200 to facilitate the configuration mode (e.g., VCCM is set to VCC) of the PLD, the control voltage vccm_to_vcc_b is at (e.g., set to, maintained at, associated with) logic low and the control voltage vccm_to_vccvt_b is at logic high. With the control voltage vccm_to_vccvt_b at logic high, the transistor 284 is off and the transistor 286 is on. With the control voltage vccm_to_vcc_b at logic low, the transistor 282 is on and the transistor 288 is off. Since the transistor 282 is on, the VCCAUX voltage supply coupled to the transistor 282 is tied to the node N3 such that the node N3 is at a voltage of VCCAUX. The voltage VCCAUX is applied to a gate of the transistor 280 and turns on the transistor 280. With the transistor 280 in the on state, the VCC voltage supply coupled to the transistor 280 is tied to the power supply voltage rail 260 such that the voltage VCCM is set to the voltage VCC. As one example, the voltage VCC is a voltage level between around 0.9 V and 1 V. Relative to the functional mode, the configuration mode utilizes a lower voltage level. At the lower voltage level, access transistors and cross-coupled inverts of the SRAM cell 235 may be protected from write operation damage associated with higher voltage levels, such as hot channel injection during SRAM cell configuration.

For the voltage control circuit 200 to facilitate the functional mode (e.g., VCCM is set to V2, which is higher than VCC) of the programmable logic device, the control voltages vccm_to_vcc_b and vccm_to_vccvt_b are at logic high and the voltage regulator 205 is on. With the control voltages vccm_to_vcc_b and vccm_to_vccvt_b at logic high, the transistors 282 and 284 are off and the transistors 286 and 288 are on. A voltage VSS (e.g., ground) is tied to the gate of the transistor 280 such that the transistor 280 is off. In this regard, the switching circuit 275 represents an open circuit to the SRAM cell 235. The voltage regulator 205 generates the voltage V2 and ties the power supply voltage rail 260 (e.g., the voltage VCCM) to the voltage V2. As one example, the voltage V2 is around 1.25 V. Relative to the configuration mode, the functional mode utilizes a higher voltage level. In an aspect, the higher voltage level may enable SRAM cells to have a sufficient overdrive voltage for controlling routing multiplexers.

For the voltage control circuit 200 to facilitate the sleep mode (e.g., VCCM is set to V3, which is lower than VCC) of the programmable logic device, the control voltage vccm_to_vcc_b is at logic high and the control voltage vccm_to_vccvt_b is at logic low. With the control voltage vccm_to_vcc_b at logic high, the transistor 282 is off and the transistor 288 is on. With the control voltage vccm_to_vccvt_b at logic low, the transistor 284 is on and the transistor 286 is off. Since the transistor 284 is on, the VCC voltage supply coupled to the transistor 284 is tied to the node N3 such that the node N3 is at a voltage of VCC. With the gate and the drain of the transistor 280 at a voltage of VCC, the source of the transistor 280 is at around VCC−Vt to maintain the transistor 280 in an on state (e.g., keep $VDS \geq VGS-Vt$ and $VGS>Vt$), where Vt is a threshold voltage of the transistor 280, VDS is voltage difference between drain and source, and VGS is a voltage difference between gate and source. In this embodiment, in the sleep mode, VCCM=VCC−Vt. In some cases, dependent on technology of the transistor 280, the threshold voltage Vt may be in a range of around 80 mV to around 150 mV. As one example, the voltage V3=1 V−150 mV=850 mV.

The SRAM cell 235 includes a pair of cross-coupled inverters 240 and 245. Each of the cross-coupled inverters 240 and 245 includes a PMOS transistor P and an NMOS transistor M. Each PMOS transistor P has a source coupled to the power supply voltage rail 260 that carries the power supply voltage VCCM. Each NMOS transistor M has a source coupled to ground and a drain coupled to the drain of the corresponding PMOS transistor P. The drains in the cross-coupled inverter 240 couple to a drain/source terminal of an access transistor 250. A remaining drain/source terminal of the access transistor 250 couple to a bit line BL (e.g., also referred to as a data line). A word line WL (e.g., also referred to as an address line) drives a gate of the access transistor 250 so that a Q signal stored in the SRAM cell 235 can drive the bit line. Similarly, the drains in cross-coupled inverter 245 couple to a drain/source terminal of an access transistor 255 that has a remaining drain/source terminal couple to a complement bit line/BL. The word line also drives the gate of the access transistor 255 so that a complement Q signal (QB) stored in the SRAM cell 235 can drive the complement bit line. Depending upon its intended use with regard to the programmable logic device configuration, the Q signal may program, for example, a truth table in a programmable logic block or a routing multiplexer in the routing structure.

The bit line BL couples through the access transistor 250 to an output of the cross-coupled inverter 240. Similarly, a complement bit line/BL couples through the access transistor 255 to an output of the cross-coupled inverter 245. The bit lines may be powered by write buffers (not illustrated) within the VCC power domain. Finally, the cross-coupled inverters 240 and 245 have the sources of their PMOS transistors P tied to the voltage rail 260 (e.g., to VCCM) so that cell power supply is part of the VCCM power domain.

Power supply regulation provided by the voltage control circuit 200 mitigates (e.g., eliminates, avoids) various power-related issues such as overvoltage damage and over stress. If the power supply voltage VCCM and the word line voltage are too high during a write operation, the access transistors 250 and 255 as well as the NMOS transistors M in the SRAM cell 235 may be damaged. The resulting loss in conductivity leads to errors during read operations. For example, suppose that the SRAM cell 235 of FIG. 2 is storing a logic zero. In the absence of damage, the true bit line will then discharge to ground during the read operation through the access transistor 250 and the NMOS transistor M in the cross-coupled inverter 235. But if the conductivities of these transistors are too low from overvoltage damage, the precharged voltage on the true bit line will not discharge sufficiently, which can lead to an erroneous read operations. Alternatively, if the VCCM level is too high during the SRAM write operation, the damage caused in the access transistors 250 and 255 in the SRAM cell 235 will eventually lead to the degradation in the write-ability of the SRAM cells, and thus the write operation will fail.

Figure 3A:
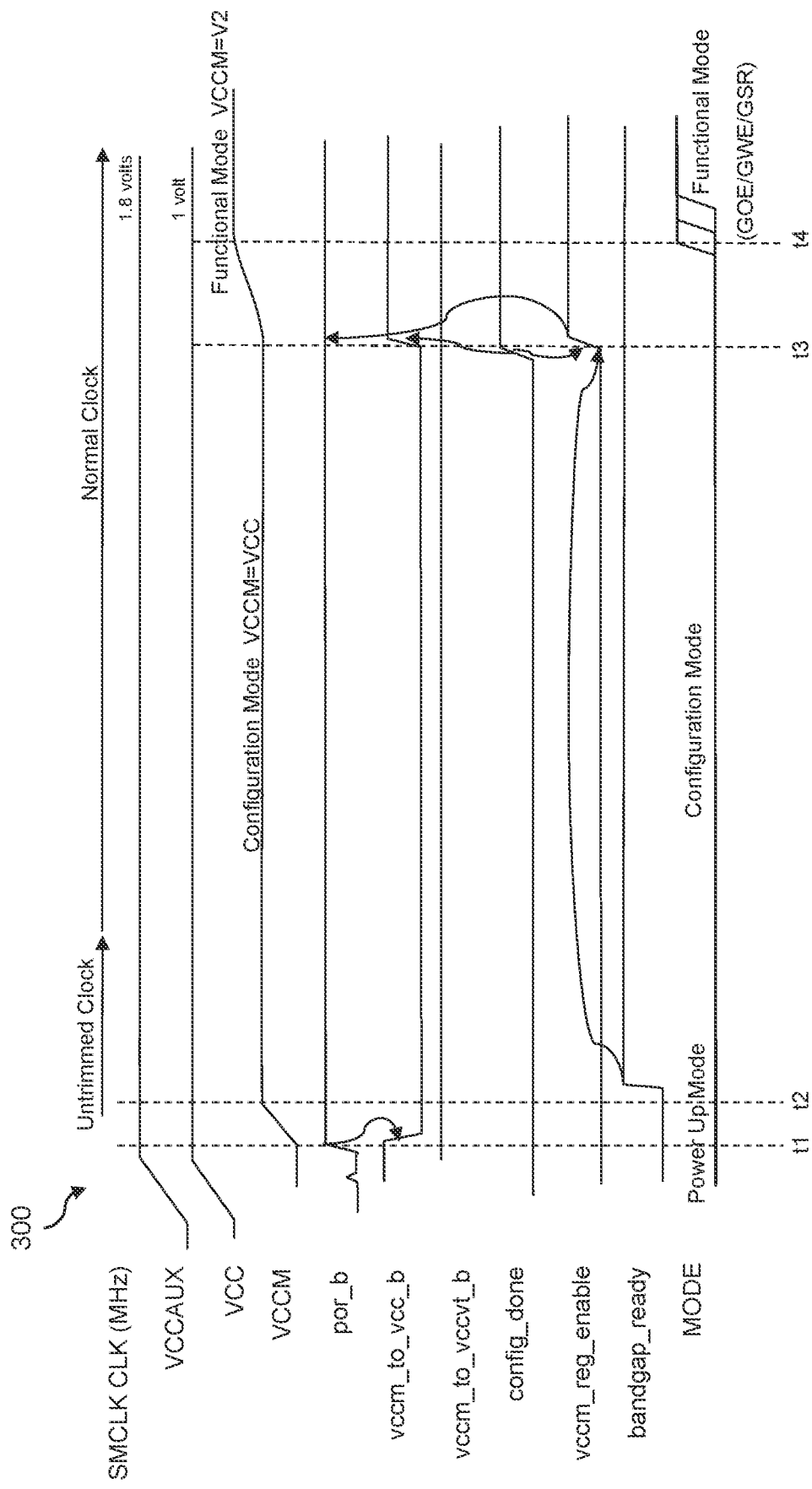
FIG. 3A illustrates a power-on and programming sequence for configuration memory cells powered by the voltage control circuit of FIG. 2 in accordance with an embodiment.

FIG. 3A illustrates a power-on and programming sequence 300 for the SRAM cell 235 as powered by the voltage control circuit 200 in accordance with an embodiment. At a start of a power-on-reset (POR) period (e.g., also referred to as a power up period) prior to a time t1, the power supply voltages VCCAUX and VCC ramp up toward their desired levels (e.g., 1.8 V for VCCAUX, 1 V for VCC). In some cases, due to the higher level for VCCAUX, the transistors 220 and 282 may be thicker-oxide transistors to protect against overvoltage damage. Other transistors shown in FIG. 2 may be relatively thin oxide transistors. In some cases, during an initial portion of the sequence 300, a clock SMCLK CLK may be an untrimmed clock. After the initial portion, the clock SMCLK CLK may be a normal clock.

At the time t1, the power supply voltages VCCAUX and VCC have been powered up to their desired levels. The control voltage vccm_to_vcc_b is set to logic low and the control voltage vccm_to_vccvt_b is at logic high to cause the voltage control circuit 200 to transition (e.g., pull up) the voltage rail 260 to a voltage level associated with the configuration mode of the PLD. In FIG. 3A, VCCM=VCC during the configuration mode. In some cases, the control voltage vccm_to_vcc_b may ramp down to logic low in response to an assertion of a signal por_b (e.g., an initial POR pulse). The signal por_b may be a wakeup signal from a circuit block that detects supplies are high enough to begin operating the programmable logic device. In an aspect, prior to the time t1, the control voltage vccm_to_vcc_b is at logic high to facilitate a bulk erase operation. In this regard, while at logic high, word lines and bitlines may be more readily turned on to allow writing (e.g., via a bulk erase operation) of the SRAM cells of the programmable logic device to a known state (e.g., 0 state in some cases). The control voltage vccm_to_vcc_b may then be asserted to effectuate the transition of the voltage VCCM to the voltage VCC to occur.

At a time t2, the voltage VCCM is at the voltage VCC (e.g., 1 V). In this regard, the voltage control circuit 200 ties the voltage rail 260 to the voltage VCC to facilitate the configuration mode to allow configuration of the SRAM cells of the programmable logic device. The control voltages vccm_to_vcc_b and vccm_to_vccvt_b are at logic low and logic high, respectively. The transistors 282 and 286 are on and the transistors 284 and 286 are off. The transistor 280 is on and has the voltage VCCAUX applied to its gate. The voltage VCC is tied to the power supply voltage rail 260.

At a time t3, configuration of the SRAM cells is complete and the voltage control circuit 200 starts to transition from facilitating the configuration mode to facilitating the functional mode of the programmable logic device. The control voltage vccm_to_vcc_b is set to logic high and the control voltage vccm_to_vccvt_b remains at logic high. The transistors 286 and 288 are on and the transistors 280, 282, and 284 are off. The voltage regulator 205 applies the voltage V2 to the power supply voltage rail 260. A signal (e.g., flag signal, indicator signal) config_done may be asserted at the time t3 to indicate that the configuration of the SRAM cells is complete. The voltage VCCM is ramped up to the voltage V2 for the functional mode. In one example, the voltage V2 is at around 1.25 V. Between the times t2 and t3, a signal bandgap_ready is asserted (e.g., ramps to logic high). In an aspect, the signal bandgap_ready may indicate that voltage and current references are within specification and ready for use.

At a time t4, the voltage VCCM is at the voltage V2 and the voltage control circuit 200 has completed its transition from facilitating the configuration mode to facilitating the functional mode. As one example, a difference between $t_4$ and $t_3$ is 5 μs. In the functional mode, global output enable (GOE), global write enable (GWE), and global set reset (GSR) are released (e.g., their associated signals are asserted).

Figure 3B:
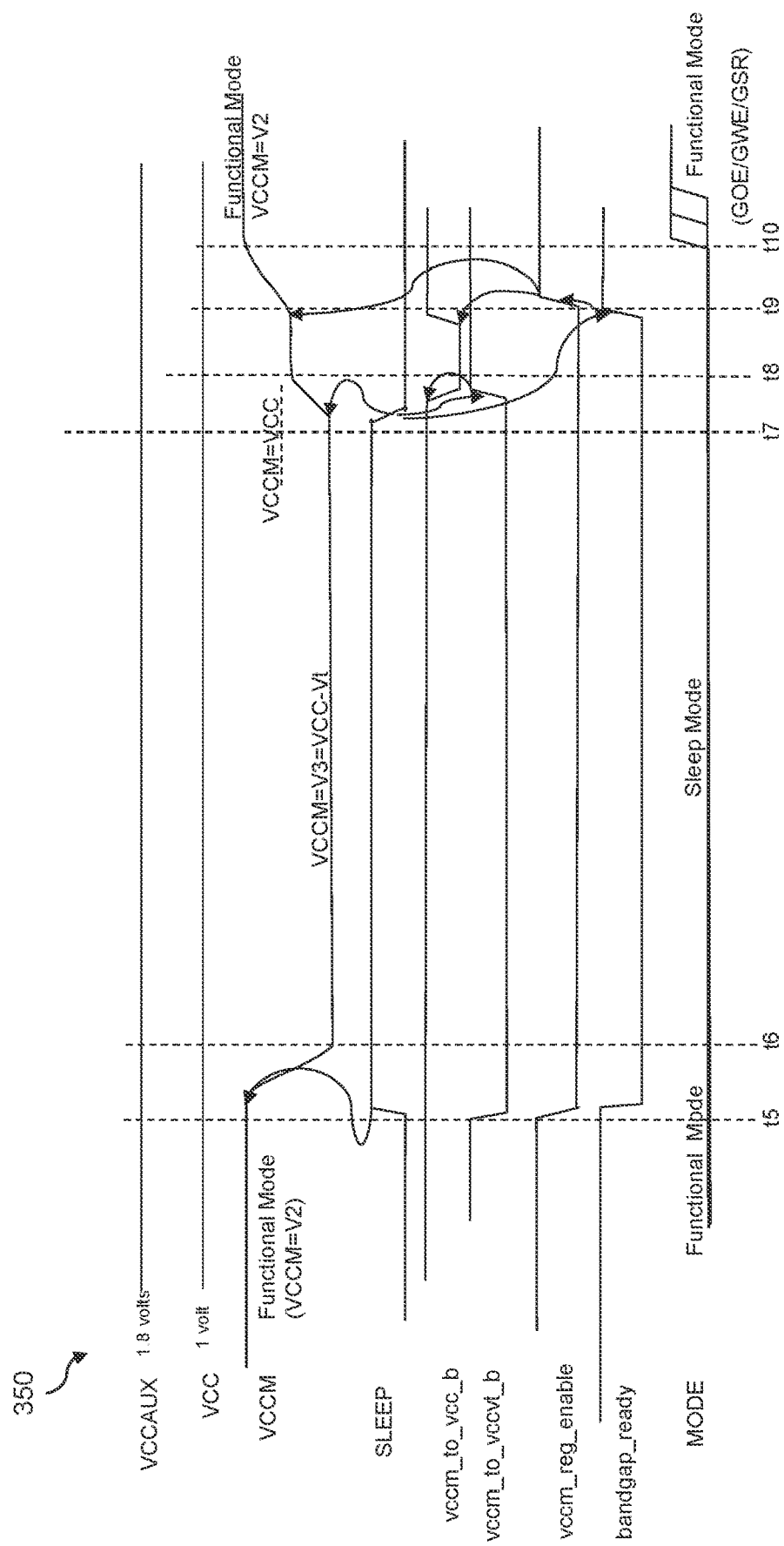
FIG. 3B illustrates a sequence to transition configuration memory cells into and out of a sleep mode in accordance with an embodiment.

FIG. 3B illustrates a sequence 350 for the SRAM cell 235 to transition the SRAM cell 235 into and out of the sleep mode in accordance with an embodiment. In an embodiment, the sequence 350 follows the sequence 300. The voltage control circuit 200 continues to facilitate the functional mode until a time t5.

At the time t5, a signal SLEEP is asserted to cause the voltage control circuit 200 to transition from facilitating the functional mode to facilitating the sleep mode. In an aspect, the signal SLEEP may be from a power management unit (PMU) to control which state devices are in. In this regard, the PMU may control the mode (e.g., sleep mode, configuration mode, functional mode) that is facilitated by the voltage control circuit 200. The control voltage vccm_to_vcc_b is maintained at logic high and the control voltage vccm_to_vccvt_b is set to logic low. The voltage VCCM ramps from the voltage V2 toward the voltage V3. In one case, the voltage VCCM ramps down such that VCCM=V3=VCC−Vt. In one example, V3 is at around 850 mV. In an aspect, as shown in the sequence 350, the signals vccm_reg_enable and bandgap_ready are deasserted (e.g., transitioned to logic low) to disable the voltage regulator 205. In some cases, disabling the voltage regulator 205 (e.g., disabling at least some components of the voltage regulator 205) during the sleep mode may conserve power. In this regard, for instance, the differential amplifier 210 is disabled and the gate of the transistors 220 and 265 are pulled to ground. In other aspects, during the sleep mode, the signals vccm_reg_enable and/or bandgap_ready may stay asserted and/or the voltage regulator 205 may remain enabled.

At a time t6, the voltage control circuit 200 has transitioned from facilitating the functional mode to facilitating the sleep mode. The voltage VCCM is at the voltage V3. In FIG. 3, a difference between $t_6$ and $t_5$ is 5 μs. At a time t7, the control signal SLEEP is deasserted (e.g., transitioned to logic low). The control signal SLEEP may be deasserted to cause the voltage control circuit 200 to transition from facilitating the sleep mode to facilitating the functional mode. The control voltage vccm_to_vcc_b is set to logic low and the control voltage vccm_to_vccvt_b is set to logic high. In an aspect, as shown in FIG. 3B, to transition from facilitating the sleep mode to facilitating the functional mode, the voltage control circuit 200 first ramps the voltage VCCM from the voltage V3 to the voltage VCC (as shown between the time t7 and a time t8), and then from the voltage VCC to the voltage V2 (as shown between a time t9 and a time t10). The voltage VCCM ramps to the voltage VCC (e.g., the voltage level associated with the configuration mode).

At the time t8, the voltage VCCM is at the voltage VCC. At the time t9, the voltage control circuit 200 continues with ramping the voltage VCC to the voltage V2 to facilitate the functional mode. The control voltage vccm_to_vcc_b is set to logic high and the control voltage vccm_to_vccvt_b is maintained at logic high. The voltage VCCM is ramped up to the regulated voltage level V2 (e.g., 1.25 V) provided by the voltage regulator 205 for the functional mode. As one example, a difference between t9 and t7 is 10 μs. The signals vccm_reg_enable and bandgap_ready are asserted (e.g., transitioned to logic high). In some cases, the time t9 may be soon after the bandgap_ready has transitioned from logic low to logic high. The vccm_reg_enable may transition from logic low to logic high in response to the signal bandgap_ready being at logic high. At the time t10, the voltage control circuit 200 has completed its transition from facilitating the configuration mode to facilitating the functional mode, with the voltage VCCM is at the voltage V2. As one example, a difference between t10 and t9 is 5 μs.

In an aspect, pre-regulation may be performed to facilitate the transition of the voltage VCCM from the voltage V3 to the voltage V2. In this regard, pre-regulation may prevent glitching of the PLD and/or associated circuitry. For example, a pre-regulator circuit may be used to set an output of the differential amplifier 210 to a level just below or at VCC, such that when the transistor 280 is turned off (e.g., to facilitate the functional mode), the voltage regulator 205 takes control over the voltage VCCM from the switching circuit 275 and drives the voltage VCCM to the desired voltage (e.g., the voltage V2). Without pre-regulation, the voltage VCCM may have a significant droop (e.g., drop down to 500 mV or 600 mV on the chip). Such a droop may trip monitoring circuitry, such as safety circuitry that monitors the voltage VCCM and resets the entire chip if tripped.

It is noted that the sequences 300 and 350 are provided by way of non-limiting examples. Other manners by which to operate a voltage control circuit may be used to facilitate the various modes (e.g., configuration mode, functional mode, sleep mode) of a PLD. For example, while in one implementation the voltage regulator 205 may be disabled during the sleep mode, the voltage regulator 205 may remain enabled during the sleep mode in other implementations. Further in this regard, while the signals vccm_reg_enable and bandgap_ready are deasserted during the sleep mode in the sequence 350, other implementations may keep the signals vccm_reg_enable and bandgap_ready asserted during the sleep mode. The various signals (e.g., vccm_reg_enable, bandgap_ready, vccm_to_vcc_b, vccm_to_vccvt_b, SLEEP, etc.) may be provided to the voltage control circuit 200 and/or other circuitry and/or provided by the voltage control circuit 200 and/or other circuitry to facilitate operation of the PLD. As known in the art, states of the various signals at various times are dependent on implementation, with the sequences 300 and 350 providing example states of these signals at various times. Furthermore, time durations provided above (e.g., 5 μs between the time t4 and t3) are provided by way of non-limiting examples and may be based on application (e.g., product specification and/or standard specification).

Figure 4A:
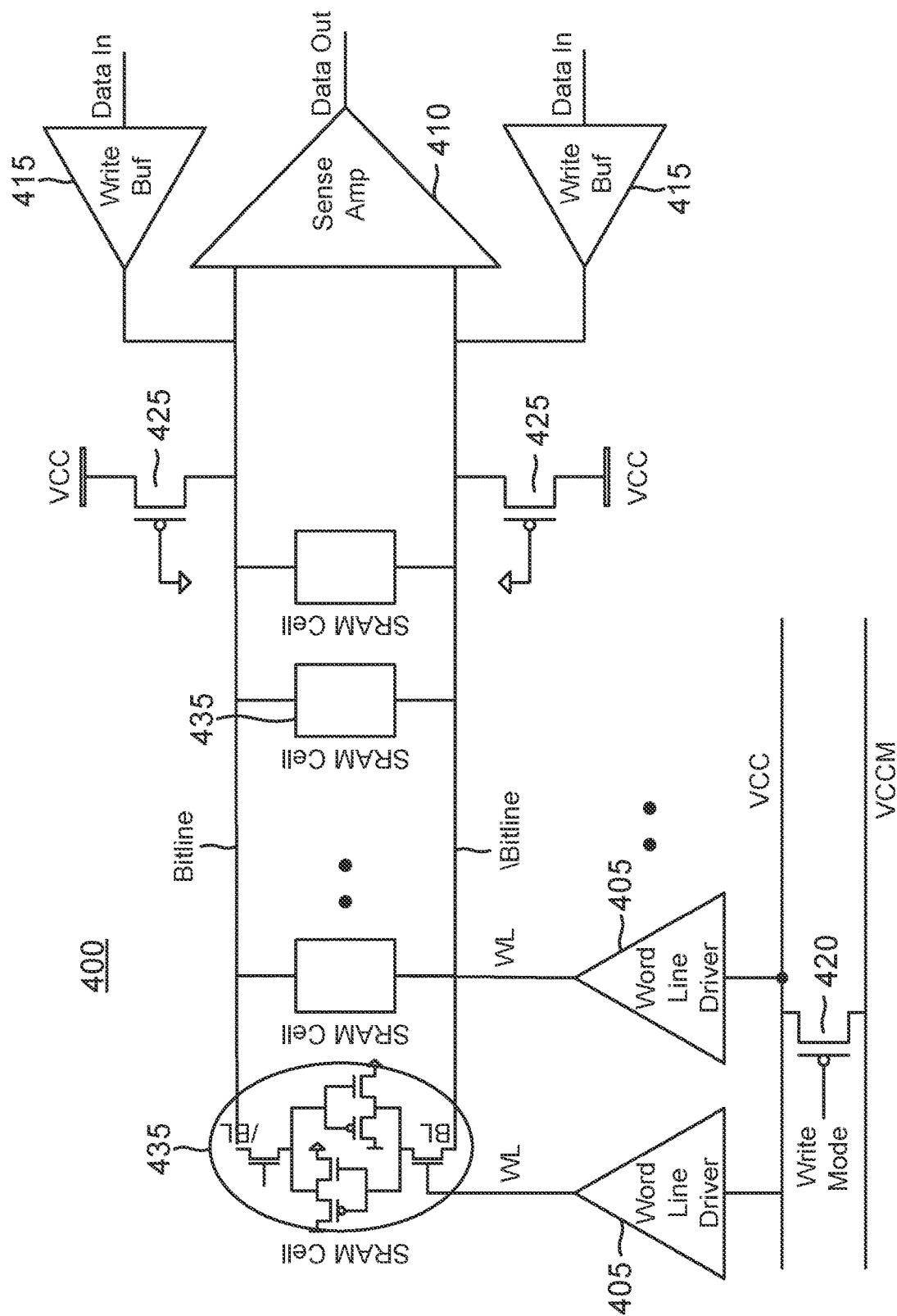
FIG. 4A illustrates a column of configuration memory cells for a PLD.

FIG. 4A illustrates a column of SRAM cells 435 for a programmable logic device 400. In an embodiment, the SRAM cell 235 of FIG. 2 may be one of the SRAM cells 435. The bit line BL and the complement bit line/BL couple to the Q and QB nodes (not explicitly labeled in FIG. 4A) for the SRAM cells in the column. Each SRAM cell 435 corresponds to a particular row that intersects the column such that each SRAM cell 435 resides at a corresponding row and column intersection. A word line WL corresponds to each row as driven by a corresponding word line driver 405. During the configuration mode, write buffers 415 drive the bit line and the complement bit line to the desired complementary binary values (either VCC or ground). The word line WL for the corresponding SRAM cell 435 is then asserted so that the desired logical value is stored in the corresponding SRAM cell 435. To fight leakage, the bit line and the complement bit line may be coupled to a VCC power node through a corresponding weak PMOS transistor 425 that has its gate grounded.

Each of the word line drivers 405 is powered by a VCC voltage rail and will thus assert its word line to VCC during a read operation. During a write operation, a write mode signal is asserted by being brought low to switch on a PMOS transistor 420 that couples between the VCC voltage rail and the VCCM voltage rail. The word lines can thus be asserted to the power supply voltage VCCM during the write operation.

Figure 4B:
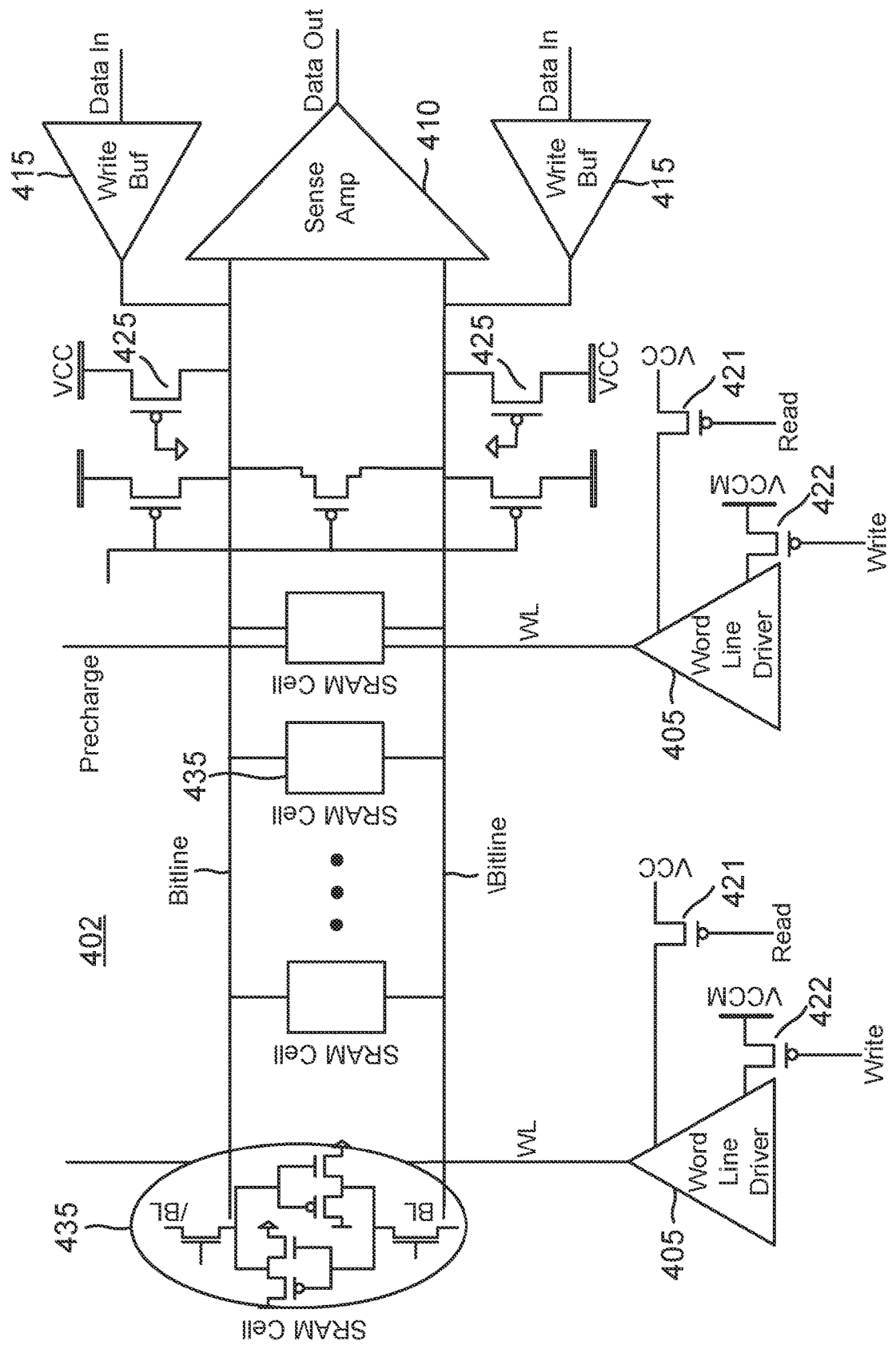
FIG. 4B illustrates another implementation of a column of configuration memory cells for a PLD.

FIG. 4B illustrates another implementation of a column of SRAM cells 435 for another programmable logic device 402. In an embodiment, the SRAM cell 235 of FIG. 2 may be one of the SRAM cells 435. In FIG. 4B, different circuitry is associated with word line drivers 405. In this regard, each of the word line drivers 405 is selectively powered by a VCC voltage rail through a PMOS transistor 421 during a read operation, or by a VCCM voltage rail through a PMOS transistor 422 during a write operation. In this embodiment, each of the word line drivers 405 will thus assert its word line to VCC during a read operation, and to VCCM during a write operation, in response to the switching of the transistors 421 and 422 (e.g., responsive to appropriate read and write signals).

Thus, in the embodiment illustrated in FIG. 4B, each of the word line drivers 405 can be selectively coupled to different power supplies (e.g., VCC or VCCM). In some embodiments, read and write signals used in this and similar embodiments may be implemented as active high signals, such that they decouple the associated PMOS transistors 421 and 422 when asserted high.

It is noted that voltage levels/supplies (e.g., VCC, VCCM) described with reference to FIGS. 4A and 4B may vary depending on the desired application and implementation, as would be known by one skilled in the art.

Figure 5:
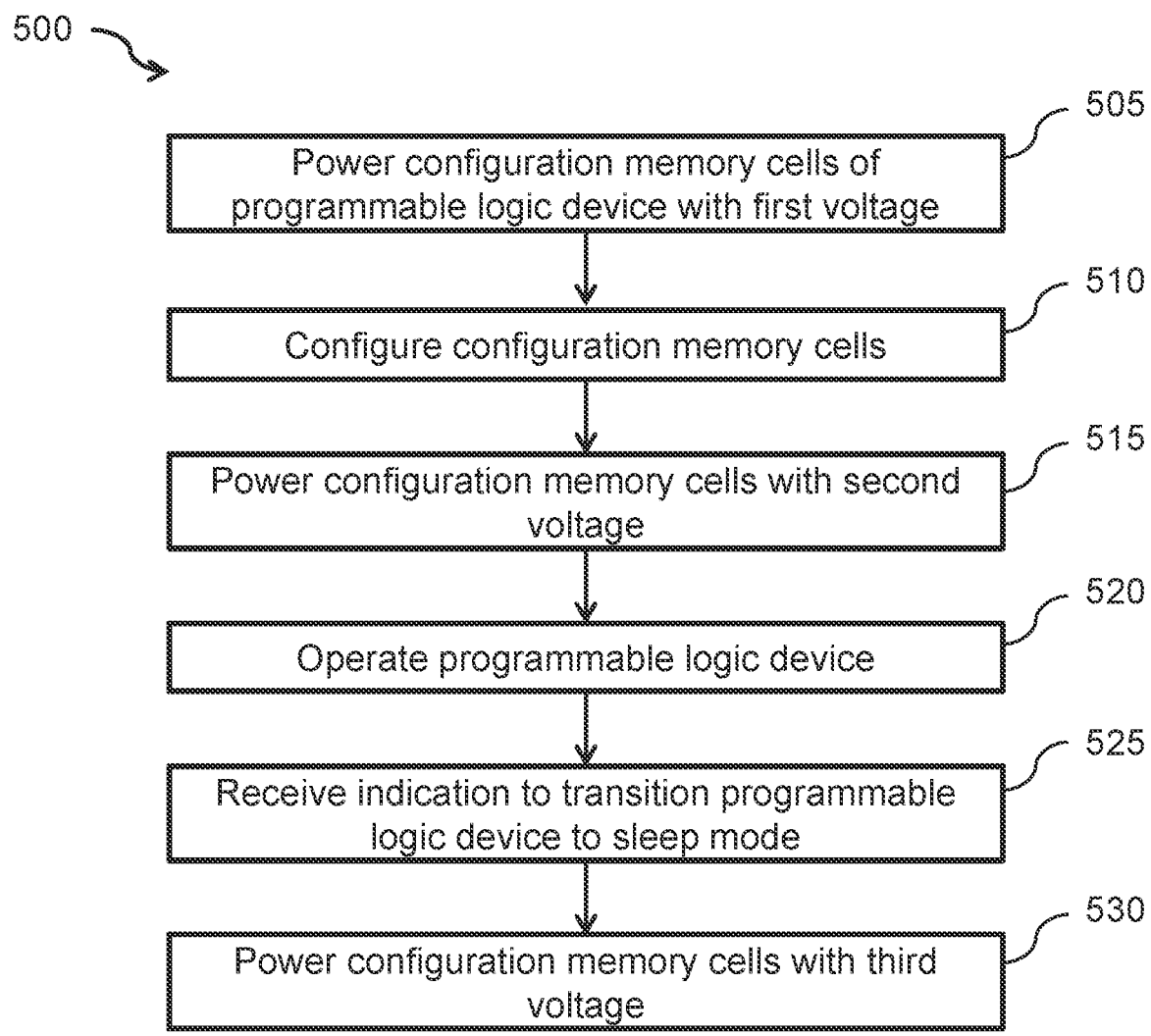
FIG. 5 illustrates a flow diagram of an example process for facilitating power supply regulation for PLDs in accordance with an embodiment of the disclosure.

FIG. 5 illustrates a flow diagram of an example process 500 for facilitating power supply regulation for PLDs in accordance with an embodiment of the disclosure. For explanatory purposes, the example process 500 is described herein with reference to a PLD powered using the voltage control circuit 200 of FIG. 2, although the example process 500 may be utilized with other PLDs and/or other voltage control circuits. Note that one or more operations may be combined, omitted, and/or performed in a different order as desired.

At block 505, configuration memory cells (e.g., including the SRAM cell 235) of the PLD are powered with a first voltage (e.g., the voltage VCC). The configuration memory cells may be coupled to the voltage rail 260. The first voltage may be applied to the voltage rail 260. The voltage regulator 205 is disabled and the switching circuit 275 is operated according to the state of the signals vccm_to_vcc_b and vccm_to_vccvt_b. In an aspect, with reference to FIG. 3A, to power the configuration memory cells with the first voltage, the signal vccm_to_vcc_b is at logic low (e.g., asserted) and the signal vccm_to_vccvt_b is at logic high (e.g., deasserted). In this regard, the transistors 280 and 282 are on and the transistor 284 is off. In an embodiment, prior to powering the configuration memory cells with the first voltage, a bulk erase operation is performed on the configuration memory cells to set the configuration memory cells to a known state. In some cases, performing of a bulk erase operation may help avoid excessive current surges in the PLD as it is powered up. In some cases, to facilitate the bulk erase operation, the state of the signals vccm_to_vcc_b and vccm_to_vccvt_b may be at appropriate levels to allow word lines and bit lines to be turned on.

At block 510, the configuration memory cells are configured (e.g., programmed) while the configuration memory cells are powered by the first voltage. In this regard, the PLD is in the configuration mode. At block 515, power the configuration memory cells with a second voltage. At block 520, the PLD is operated while the configuration memory cells are powered with the second voltage. In this regard, the PLD is in the functional mode. The second voltage may be higher than the first voltage. The second voltage may be applied to the power supply voltage rail. In one example, the second voltage is around 1.25 V. The voltage regulator 205 is enabled to provide the second voltage and the switching circuit 275 is operated according to the state of the signals vccm_to_vcc_b and vccm_to_vccvt_b. In an aspect, with reference to FIG. 3A, to power the configuration memory cells with the second voltage, the signals vccm_to_vcc_b and vccm_to_vccvt_b are at logic high (e.g., deasserted), and thus the switching circuit 275 represents an open circuit to the configuration memory cells. In this regard, the transistors 280, 282, and 284 are off.

At block 525, an indication is received to transition the PLD to a sleep mode. In some aspects, the indication may be received by the voltage control circuit 200 from a control circuit. In some cases, the control circuit may generate the indication in response to a user command to enter the sleep mode. For example, the PLD may be included in a device (e.g., a phone) of the user. The user command may be a command to place the device in a low-power mode of the device. Absent such an indication, the PLD continues to operate in the functional mode.

At block 530, the configuration memory cells are powered with a third voltage in response to the indication. The third voltage may be lower than the first voltage. The third voltage may be applied to the voltage rail 260. The voltage regulator 205 is disabled and the switching circuit 275 is operated according to the state of the signals vccm_to_vcc_b and vccm_to_vccvt_b. In an aspect, with reference to FIG. 3B, to power the configuration memory cells with the third voltage, the signal vccm_to_vcc_b is at logic high (e.g., deasserted) and the signal vccm_to_vccvt_b is at logic low (e.g., asserted). In this regard, the transistors 280 and 284 are on and the transistor 282 is off. In one example, the third voltage may be a difference between the first voltage and the threshold voltage of the transistor 280. As ICs that include PLDs may include hundreds of thousands to millions of configuration memory cells, placing these configuration memory cells to the sleep mode has significant power savings for the ICs. In some instances, power consumed by the PLDs during the sleep mode may be less than half power consumed by the PLDs during the functional mode.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A method comprising:
powering a voltage rail to a first voltage by:
turning on a first transistor to couple a first power supply node carrying a fourth voltage to a second transistor; and
turning on the second transistor coupled to a second power supply node carrying the first voltage to tie the second power supply node to the voltage rail, wherein the second transistor turns on in response to the fourth voltage, and wherein the voltage rail is coupled to a plurality of configuration memory cells;
powering the plurality of configuration memory cells of a programmable logic device with the first voltage provided on the voltage rail;
while the plurality of configuration memory cells is powered by the first voltage, configuring the plurality of configuration memory cells;
operating the programmable logic device while the plurality of configuration memory cells is powered with a second voltage higher than the first voltage; and
powering the plurality of configuration memory cells with a third voltage lower than the first voltage in response to a first indication to transition the programmable logic device to a sleep mode of the programmable logic device.

2. The method of claim 1, further comprising:
receiving a second indication to transition the programmable logic device out of the sleep mode; and
powering the plurality of configuration memory cells with the second voltage in response to the second indication.

3. The method of claim 1, further comprising:
after the configuring the plurality of configuration memory cells, powering the voltage rail to the second voltage; and
powering the voltage rail to the third voltage in response to the first indication.

4. The method of claim 3, further comprising powering the voltage rail to the second voltage in response to a second indication to transition the programmable logic device out of the sleep mode.

5. The method of claim 3, wherein the powering the voltage rail to the second voltage comprises:
turning off the second transistor;
generating, by a voltage regulator coupled to the voltage rail, the second voltage; and
providing the second voltage to the voltage rail.

6. The method of claim 5, wherein the voltage regulator is disabled during the configuring of the plurality of configuration memory cells and/or during the sleep mode of the programmable logic device.

7. The method of claim 3, wherein the powering the voltage rail to the third voltage comprises:
turning off the first transistor; and
turning on the second transistor and a third transistor to couple a third power supply node carrying the first voltage to the second transistor, wherein the third power supply node is coupled to the third transistor.

8. The method of claim 7, wherein the third voltage is a difference between the first voltage and a threshold voltage associated with the second transistor.

9. The method of claim 1, further comprising, prior to the powering with the first voltage, performing a bulk erase operation on the plurality of configuration memory cells.

10. A system comprising:
a programmable logic device comprising a plurality of configuration memory cells, wherein the plurality of configuration memory cells are coupled to a voltage rail; and
a voltage control circuit comprising:
  a switching circuit configured to selectively provide a first voltage to the voltage rail or a third voltage lower than the first voltage to the voltage rail, wherein the first voltage is associated with configuring the plurality of configuration memory cells, wherein the third voltage is associated with a sleep mode of the programmable logic device, and wherein the switching circuit comprises:
    a first transistor coupled to the voltage rail; and
    a second transistor coupled to a gate of the first transistor; and
  a voltage regulator configured to generate a second voltage higher than the first voltage and provide the second voltage to the voltage rail, wherein the second voltage is associated with operating the programmable logic device.

11. The system of claim 10, wherein the switching circuit further comprises:
a third transistor coupled to the gate of the first transistor; and
a transistor stack coupled to the gate of the first transistor.

12. The system of claim 10, wherein the voltage regulator comprises:
a resistor stack coupled to the voltage rail;
an amplifier coupled to a reference voltage generator and the resistor stack; and
a transistor coupled to the amplifier and the voltage rail.

13. The system of claim 10, wherein the first transistor is coupled to a first power supply node carrying the first voltage, and wherein the first transistor is configured to selectively couple the first power supply node to the voltage rail.

14. The system of claim 13, wherein the second transistor is coupled to a second power supply node carrying a fourth voltage, and wherein the second transistor is configured to selectively couple the fourth voltage to the first transistor.

15. The system of claim 14, wherein the switching circuit is configured to provide the first voltage to the voltage rail when the fourth voltage is coupled to the first transistor.

16. A system comprising:
a programmable logic device comprising a plurality of configuration memory cells, wherein the plurality of configuration memory cells are coupled to a voltage rail; and
a voltage control circuit comprising:
  a switching circuit configured to selectively provide a first voltage to the voltage rail or a third voltage lower than the first voltage to the voltage rail, wherein the first voltage is associated with configuring the plurality of configuration memory cells, wherein the third voltage is associated with a sleep mode of the programmable logic device, and wherein the switching circuit comprises:
    a first transistor coupled to a first power supply node carrying the first voltage, wherein the first transistor is configured to selectively couple the first power supply node to the voltage rail; and
    a second transistor coupled to a second power supply node carrying the first voltage, wherein the second transistor is configured to selectively couple the first voltage to a gate of the first transistor; and
  a voltage regulator configured to generate a second voltage higher than the first voltage and provide the second voltage to the voltage rail, wherein the second voltage is associated with operating the programmable logic device.

17. The system of claim 16, wherein the switching circuit is further configured to provide the third voltage to the voltage rail when the first voltage is coupled to the gate of the first transistor.

18. The system of claim 17, wherein the third voltage is a difference between the first voltage and a threshold voltage associated with the first transistor, wherein the first transistor is configured to selectively decouple from the voltage rail, and wherein the voltage regulator is configured to generate the second voltage when the first transistor is decoupled from the voltage rail.

19. The system of claim 10, wherein the switching circuit further comprises a third transistor coupled to the first transistor and the second transistor.

20. The system of claim 10, wherein the switching circuit further comprises a transistor stack coupled to the first transistor and the second transistor.

* * * * *